(12) United States Patent
Kuramoto

(10) Patent No.: US 7,518,162 B2
(45) Date of Patent: Apr. 14, 2009

(54) SEMICONDUCTOR LIGHT EMITTING DEVICE

(75) Inventor: Kyosuke Kuramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 292 days.

(21) Appl. No.: 11/668,640

(22) Filed: Jan. 30, 2007

(65) Prior Publication Data
US 2007/0176203 A1    Aug. 2, 2007

(30) Foreign Application Priority Data
Feb. 2, 2006   (JP)  ............................. 2006-026127
Jan. 18, 2007  (JP)  ............................. 2007-009373

(51) Int. Cl.
*H01L 33/00* (2006.01)

(52) U.S. Cl. .................... 257/101; 257/102; 257/17; 257/E33.028

(58) Field of Classification Search .................. 257/101, 257/E33.028
See application file for complete search history.

(56) References Cited

U.S. PATENT DOCUMENTS
6,657,234 B1 * 12/2003 Tanizawa ..................... 257/79

FOREIGN PATENT DOCUMENTS
JP      2002-246642      8/2002

* cited by examiner

*Primary Examiner*—Tu-Tu V Ho
(74) *Attorney, Agent, or Firm*—Leydig, Voit & Mayer, Ltd.

(57) ABSTRACT

A semiconductor light emitting device has a gallium nitride compound semiconductor, and a first cladding layer of a first conductivity type, an active layer, an electron barrier layer of a second conductivity type and made of $In_xAl_yGa_{1-x-y}N$ ($0 \leq x \leq 1$ and $0 \leq y \leq 1$), and a second cladding layer of the second conductivity type, laminated, in order, on a substrate. The electron barrier layer has a larger band gap than each of the active layer and the second cladding layer. The thickness of the electron barrier layer is in a range from 2 nm to 7 nm.

10 Claims, 4 Drawing Sheets

SEMICONDUCTOR LIGHT EMITTING DEVICE

BACKGROUND OF THE INVENTION

1. Field of the Invention

The present invention relates to a semiconductor light emitting device, such as a semiconductor laser or a light emitting diode, using a gallium nitride compound semiconductor.

2. Background Art

In recent years, a semiconductor laser using a nitride III-V compound semiconductor such as AlInGaN has been actively researched and developed as a semiconductor laser which can emit a light in a region, from a blue region to an ultraviolet region, which is required for high density promotion in an optical disc. Thus, the semiconductor laser using the nitride III-V compound semiconductor has already been put to practical use. The semiconductor laser using the nitride III-V compound semiconductor (see, for example, Japanese Patent Laid-Open No. 2002-246642).

In each of the semiconductor lasers, using the nitride III-V compound semiconductors, which have been reported to date, in order that electrons may overflow from an active layer into a p-type cladding layer side to reduce a luminance efficiency, an electron barrier layer is inserted into a side closer to a p-side electrode than to the active layer. Here, the electron barrier layer has a larger band gap than that of the active layer, and has a function of suppressing the overflow of the electrons.

AlGaN or AlInGaN is used as a material for the electron barrier layer. This material has the large band gap as an Al composition ratio thereof becomes larger. In principle, this material becomes the large barrier against the electrons, and thus has the large effect of suppressing the overflow of the electrons. However, when the Al composition ratio of AlGaN or AlInGaN having a small lattice constant becomes large, the crystalline becomes poor, so that crystal defects are generated in the electron barrier layer or in the vicinity thereof. Thus, there is encountered a problem such that the luminance efficiency is actually reduced all the more because of non-radiative recombination due to generation of the crystal defects.

In addition, the electron barrier layer has the larger band gap than that of each of a layer overlying the electron barrier layer and a layer underlying the electron barrier layer. Thus, although the electron barrier layer suppresses the overflow of the electrons, the electron barrier layer impedes injection of holes into the active layer side. In order to reduce this bad influence, the electron barrier layer is normally doped with a p-type impurity. Mg is used as a p-type dopant in the gallium nitride compound semiconductor. However, there is caused a problem such that the luminance efficiency is reduced through light absorption due to Mg as the p-type dopant.

SUMMARY OF THE INVENTION

In the light of the foregoing, the present invention has been made in order to solve the above-mentioned problems and it is therefore an object of the present invention to provide a semiconductor light emitting device which has a high luminance efficiency.

A semiconductor light emitting device according to the present invention is a semiconductor light emitting device having a gallium nitride compound semiconductor, in which a first cladding layer of a first conductivity type, an active layer, an electron barrier layer of a second conductivity type made of $In_xAl_yGa_{1-x-y}N$ ($0 \leq x \leq 1$ and $0 \leq y \leq 1$), and a second cladding layer of the second conductivity type are laminated in order on a substrate. The electron barrier layer has a larger band gap than that of each of the active layer and the second cladding layer. A thickness of the electron barrier layer is equal to or larger than 2 nm and equal to or smaller than 7 nm.

According to the present invention, it is possible to obtain the semiconductor light emitting element which has the high luminance efficiency.

Other and further objects, features and advantages of the invention will appear more fully from the following description.

DETAILED DESCRIPTION OF THE PREFERRED EMBODIMENTS

First Embodiment

Figure 1:
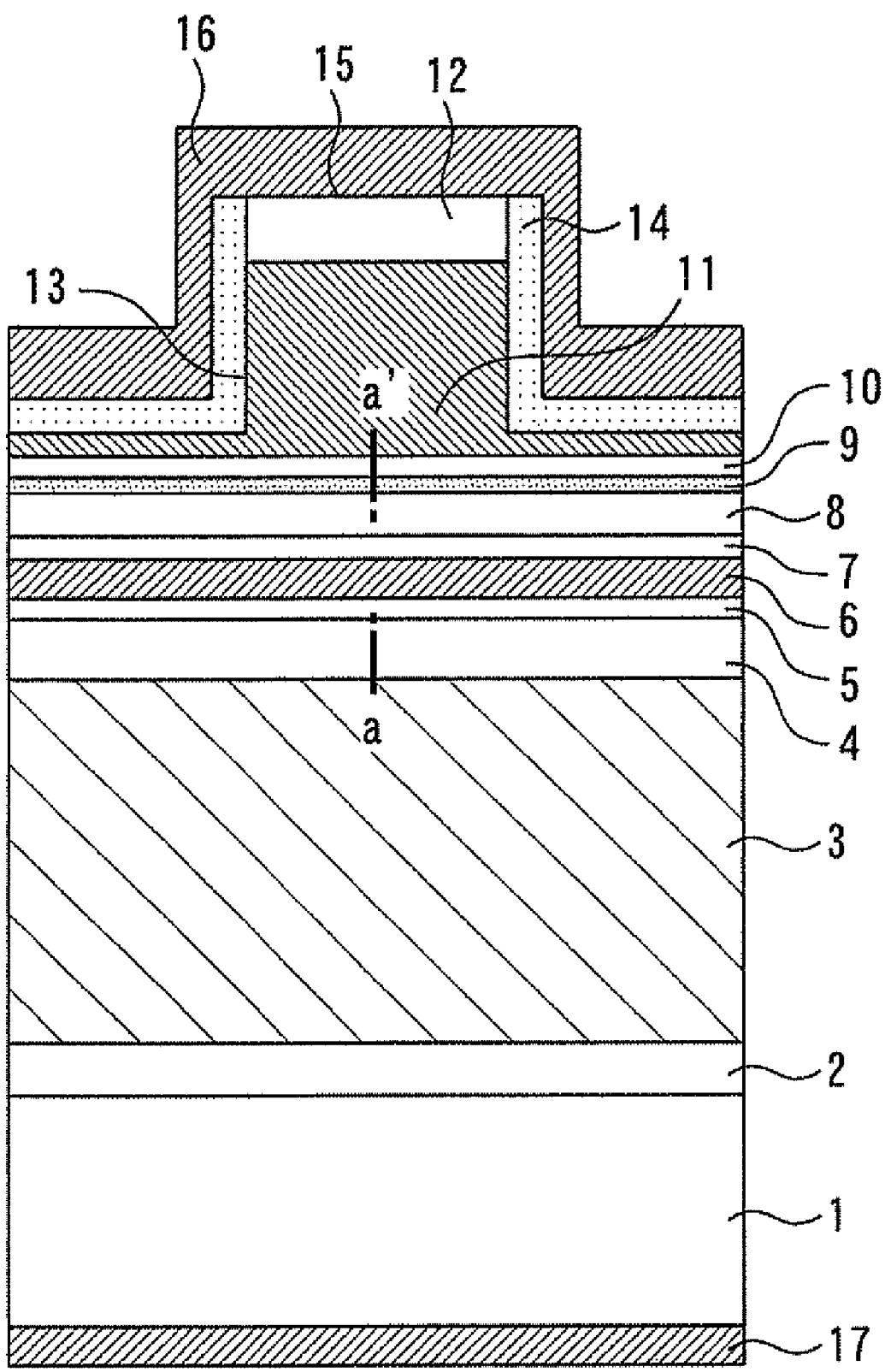
FIG. 1 is a cross sectional view showing a semiconductor light emitting device according to a first embodiment of the present invention.

FIG. 1 is a cross sectional view showing a semiconductor light emitting device according to a first embodiment of the present invention. An n-type GaN buffer layer 2 having a thickness of 1.0 µm, an n-type AlGaN cladding layer 3 having a thickness of 1.0 µm and having an Al composition ratio of 0.07, an n-type GaN light guide layer 4 having a thickness of 100 nm, and an un-doped InGaN optical confinement layer 5 having a thickness of 7 nm are laminated in this order on a GaN substrate 1. In Addition, a multiple quantum well active layer 6 is laminated on the un-doped InGaN optical confinement layer 5. Here, three un-doped InGaN well layers each having a thickness of 3.5 nm and each having an In composition ratio of 0.14, and two un-doped InGaN barrier layers each having a thickness of 7.0 nm and each having an In composition ratio of 0.02 are alternately laminated one after another, thereby forming the multiple quantum well active layer 6. Also, an un-doped InGaN optical confinement layer 7 having a thickness of 20 nm and having an In composition ratio of 0.02, an un-doped AlGaN intermediate layer 8 having a thickness of 30 nm and having an Al composition ratio of 0.03, an un-doped InGaN intermediate layer 9 having a thickness of 5 nm and having an In composition ratio of 0.02, a p-type AlGaN electron barrier layer 10 having a thickness of 4.5 nm (20 nm in a conventional semiconductor light emitting device) and having an Al composition ratio of 0.18, a p-type AlGaN cladding layer 11 having a thickness of 400 nm and having an Al composition ratio of 0.07, and a p-type GaN contact layer 12 having a thickness of 100 nm are laminated in this order on the multiple quantum well active layer 6.

In addition, a ridge 13 is formed in a <1-100> orientation in the p-type AlGaN cladding layer 11 and the p-type GaN contact layer 12 by etching. A width of the ridge 13, for example, is 1.5 μm and an etching depth thereof, for example, is 450 nm. An SiO$_2$ film 14 having a thickness of 200 nm is formed on a side face portion or a transverse bottom surface portion of the ridge 13 so as to cover the ridge 13. An opening 15 is formed in an upper surface of the SiO$_2$ film 14 and above the ridge 13. Also, a p-side electrode 16 and the p-type GaN contact layer 12 electrically contact each other through the opening 15. The p-side electrode 16 has a structure in which a Pt film and an Au film are laminated in order. An n-side electrode 17 having a structure in which a Ti film and an Al film are laminated in order is formed on a back face of the GaN substrate 1.

In addition, the substrate is cleaved so that a length of a resonator of the semiconductor light emitting device is 600 μm. A front end face is coated with a low reflection film having a reflectivity of 20%, and a back end face is coated with a high reflection film having a reflectivity of 95%.

Next, a method of manufacturing the semiconductor light emitting device according to the first embodiment of the present invention will now be described in detail. Firstly, a surface of the GaN substrate 1 is cleaned by utilizing a thermal cleaning method or the like. Next, the n-type GaN buffer layer 2 is grown at a growth temperature of, for example, 1,000° C. on the surface of the GaN substrate 1 by utilizing a metal organic chemical vapor deposition (MOCVD) method. After that, the n-type AlGaN cladding layer 3, the n-type GaN light guide layer 4, the un-doped InGaN optical confinement layer 5, the multiple quantum well active layer 6, the un-doped InGaN optical confinement layer 7, the un-doped AlGaN intermediate layer 8, the un-doped InGaN intermediate layer 9, the p-type AlGaN electron barrier layer 10, the p-type AlGaN cladding layer 11, and the p-type GaN contact layer 12 are laminated in order on the n-type GaN buffer layer 2 by utilizing the MOCVD method.

Here, with regard to the growth temperature of those layers, for example, the growth temperature of each of the n-type AlGaN cladding layer 3 and the n-type GaN light guide layer 4 is set to 1,000° C. In addition, the growth temperature of each of the layers ranging from the un-doped InGaN optical confinement layer 5 to the un-doped InGaN optical confinement layer 7 is set to 740° C., and the growth temperature of the un-doped AlGaN intermediate layer 8 is set to 1,000° C. Also, the growth temperature of the un-doped InGaN intermediate layer 9 is set to 740° C., and the growth temperature of each of the layers from the p-type AlGaN electron barrier layer 10 to the p-type GaN contact layer 12 is set to 1,000° C.

After completion of the crystal growth of the semiconductor compounds described above, a photo resist is applied to the whole surface of the wafer, and a photo resist pattern having a predetermined shape corresponding to a shape of a mesa portion is formed by utilizing a photolithography technique. The etching is then performed with the resulting photo resist pattern as an etching mask until an inside of the p-type AlGaN cladding layer 11 is reached by, for example, utilizing an RIE method. The ridge 13 which comes to have a light wave guide structure is made by performing the etching. A chlorine system gas, for example, is used as an etching gas for the RIE.

Next, a so-called lift-off procedure is carried out. That is to say, the SiO$_2$ film 14 having the thickness of 0.2 μm is formed over the whole surface of the CaN substrate 1 again with the photo resist pattern used as the etching mask being left as it is by, for example, utilizing a CVD method, a vacuum evaporation method, a sputtering method or the like. Also, the SiO$_2$ film 14 formed so as to cover the ridge 13 is removed concurrently with removal of the photo resist pattern. As a result, the opening 15 is formed above the ridge 13.

Next, after the Pt film and the Au film are successively formed over the whole surface of the GaN substrate 1 by, for example, utilizing the vacuum evaporation method, the p-side electrode 16 is formed on the surfaces of the p-type GaN contact layer 12 and the SiO$_2$ film 14 by utilizing application of the photo resist, the photolithography technique, and a wet etching method or a dry etching method. After that, the Ti film and the Al film are successively formed over the whole back face of the GaN substrate 1 by utilizing the vacuum evaporation method, and alloy processing for providing ohmic contact for the n-side electrode 17 is then carried out.

After that, the GaN substrate 1 is processed into a bar shape by performing the clearage or the like, thereby forming the both end faces of the resonator. Moreover, after these resonator end faces are subjected to end face coating, the bar is cut into chips by performing the clearage or the like. After completion of the processes described above, the semiconductor light emitting device according to the first embodiment is manufactured.

Figure 2:
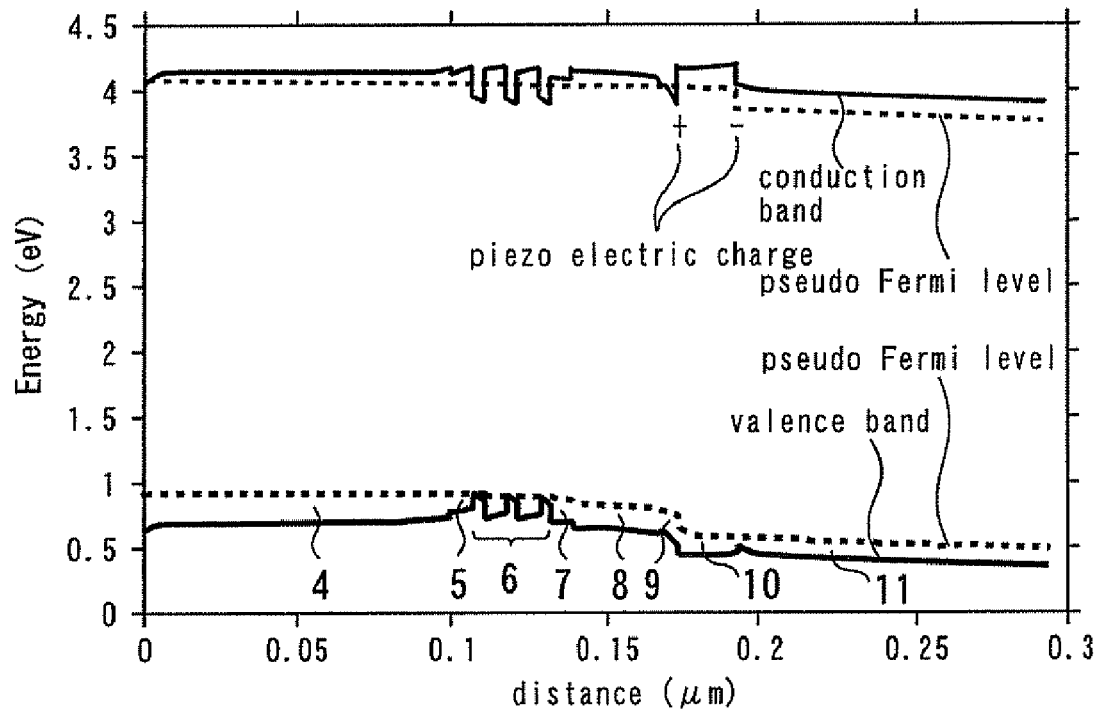
FIG. 2 shows a result of simulating a band structure in a portion a cross section of which is taken on a line a-a' of FIG. 1 in an oscillation state when the thickness of the electron barrier layer is set to 20 nm.
Figure 3:
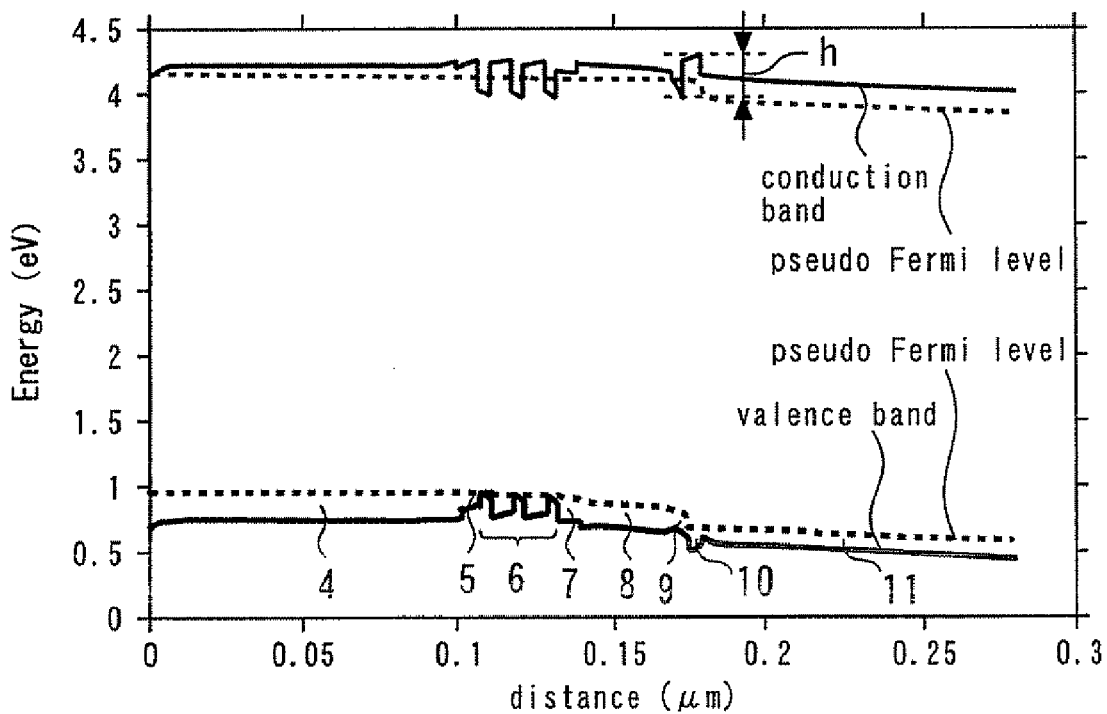
FIG. 3 shows a result of simulating a band structure in a portion a cross section of which is taken on a line a-a' of FIG. 1 in an oscillation state when the thickness of the electron barrier layer is set to 5 nm.

Here, when the individual crystals are grown in order on the GaN substrate 1, the InGaN layer undergoes a compressive strain in an intra-growth surface direction, while the AlGaN layer undergoes a tensile strain. Also, since each of these layers has a wurtzite structure, a piezo electric field is generated in the crystal growth direction due to the strain. Since the direction of the strain in the InGaN layer is different from that in the AlGaN layer, the direction of the piezo electric field in the former is also different from that in the latter. FIGS. 2 and 3 show respectively results of simulating a band structure in a portion a cross section of which is taken on a line a-a' of FIG. 1 in an oscillation state in consideration of the piezo effect. Note that, FIG. 2 shows the results of simulating the band structure when the thickness of the p-type AlGaN electron barrier layer 10 is set to 20 nm as in conventional one. Also, FIG. 3 shows the results of simulating the band structure when the p-type AlGaN electron barrier layer 10 is thinned to have the thickness of 5 nm.

As shown in FIG. 2, positive electric charges designated with a mark "+" and negative electric charges designated with a mark "–" are generated in the p-type AlGaN electron barrier layer 10 due to the piezo effect, which results in the piezo electric field being generated. As a result, the band structure of the p-type AlGaN electron barrier layer 10 is largely curved. When an overflow rate of the electrons in this case is calculated, 25.6% is obtained as the overflow rate of the electrons. Also, a differential efficiency when a reflectivity of the front end face is set to 20% and a reflectivity of the back end face is set to 95% is 1.09 W/A.

On the other hand, as shown in FIG. 3, when the p-type AlGaN electron barrier layer 10 is thinned, the accumulated positive electric charges and the accumulated negative electric charges become close to each other in distance, so that the electric field strength within the p-type AlGaN electron barrier layer 10 increases. As a result, the larger band bending occurs in the p-type AlGaN electron barrier layer 10. Thus, the p-side electrode side of the p-type AlGaN electron barrier layer 10 largely moves to the higher energy side, so that an effective height (indicated by "h" in FIG. 3) of the p-type AlGaN electron barrier layer 10 becomes high. As a result, the luminance efficiency is enhanced because an amount of electrons which go beyond the p-type AlGaN electron barrier layer 10 to overflow into the p-type AlGaN cladding layer 11 is reduced and thus the more electrons undergo the radiation recombination. In this case, the calculation results of the overflow rate of the electrons show 11.1%. Also, the differential efficiency when the reflectivity of the front end face is set to 20% and the reflectivity of the back end face is set to 95% is 1.42 W/A. This result shows that the differential efficiency in the first embodiment is greatly improved as compared with the case where the thickness of the p-type AlGaN electron barrier layer 10 is set to 20 nm in the conventional structure.

Moreover, the further thinning of the electron barrier layer results in that the problems caused by the crystal defects or the strains are also largely relaxed. As a result, the non-radiative recombination due to the crystal defects is reduced, and thus the reliability of the semiconductor light emitting device is greatly improved.

Figure 4:
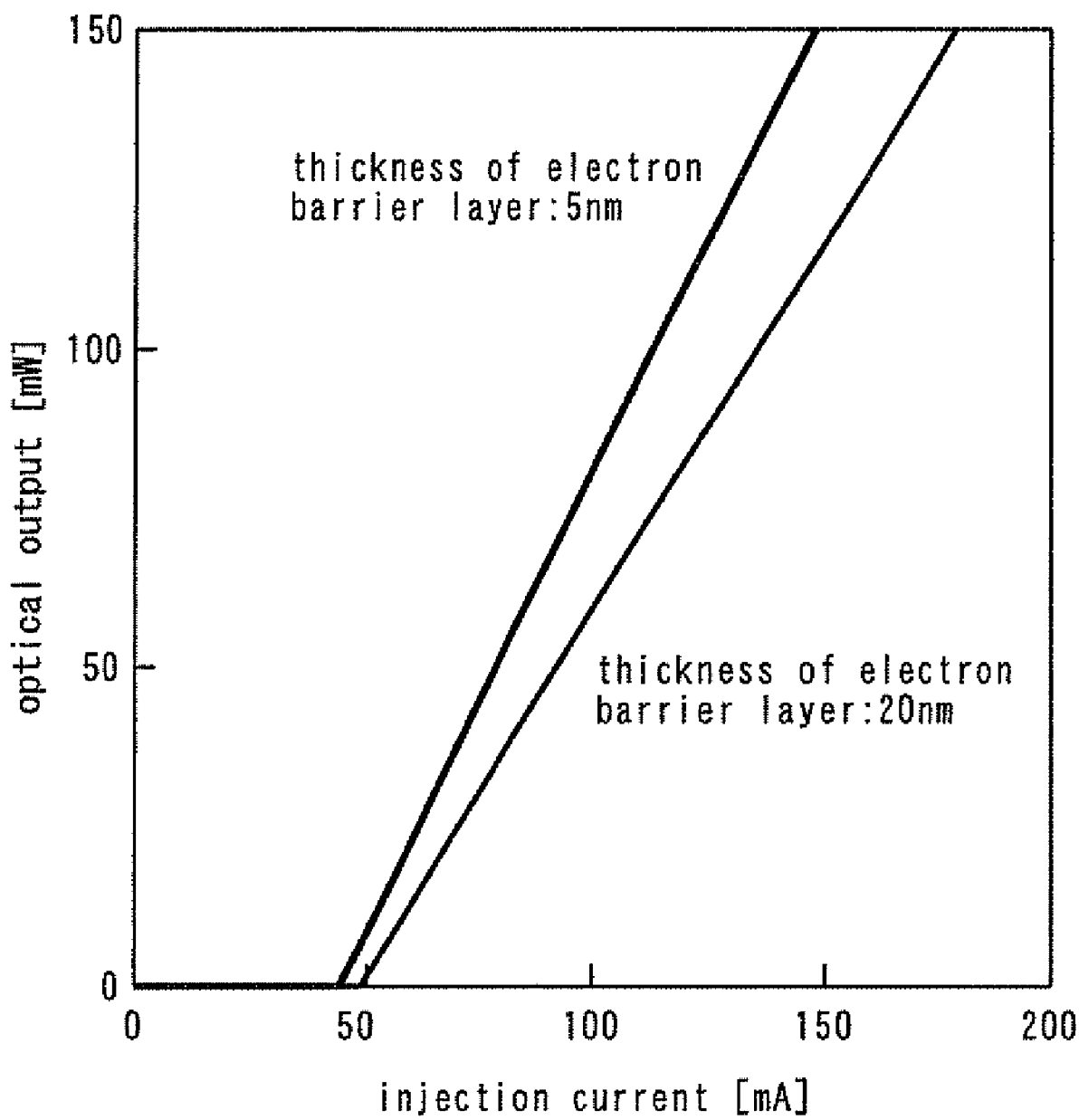
FIG. 4 shows results of a measurement of optical output vs. current characteristics of the semiconductor laser having such a structure at 75° C.

FIG. 4 shows results of a measurement of optical output vs. current characteristics of the semiconductor laser having such a structure at 75° C. The measurement results show that a threshold is 45 mA and the differential efficiency is 1.45 W/A, which is improved as compared with the case where the threshold is 49 mA and the differential efficiency is 1.15 W/A in the conventional structure having the p-type AlGaN electron barrier layer 10 with 20 nm thickness.

Figure 5:
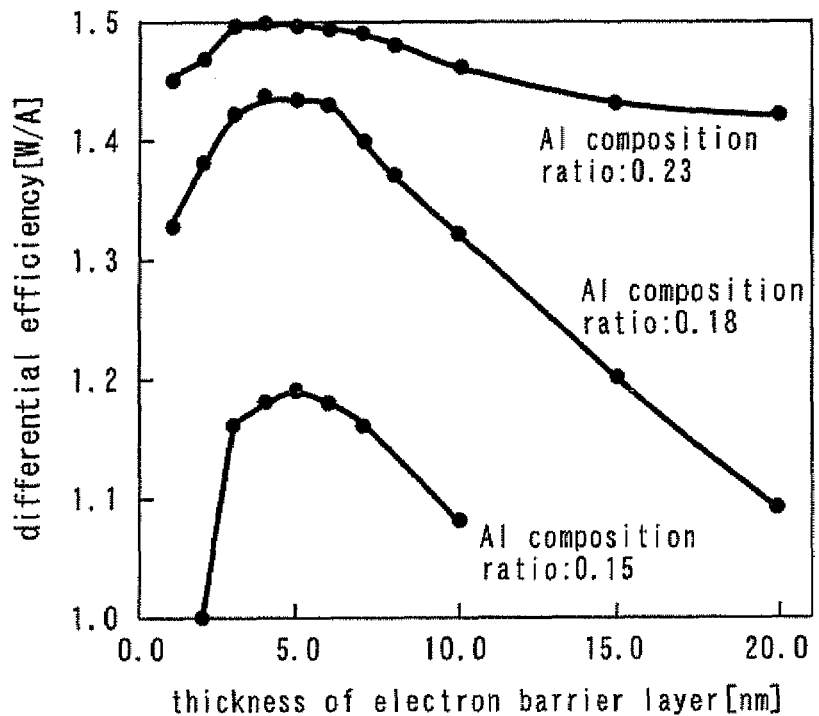
FIG. 5 shows results of calculating slope efficiencies of the semiconductor light emitting device when the thickness of the electron barrier layer is changed.
Figure 6:
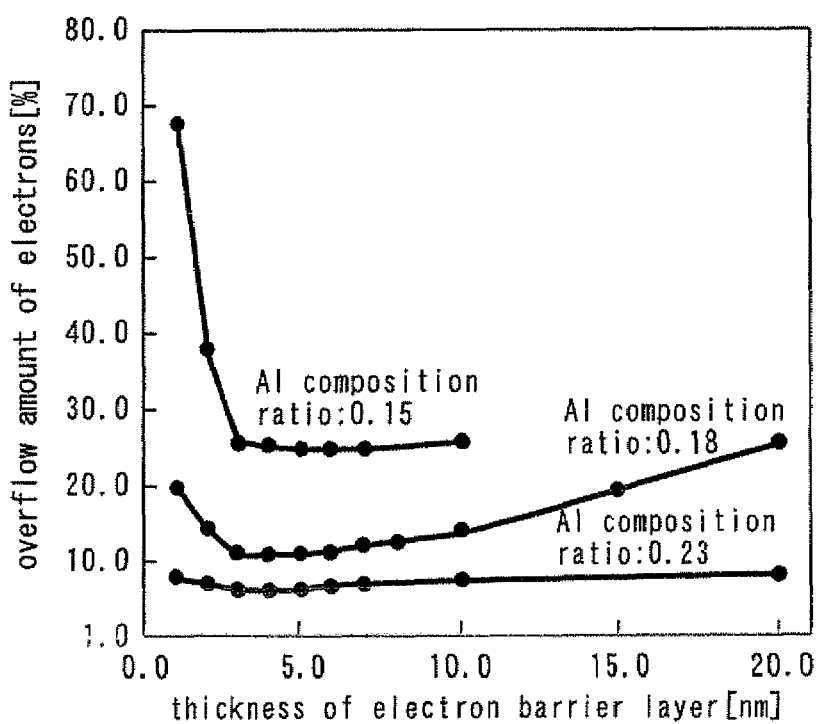
FIG. 6 shows results of calculating a rate of the electrons overflowing from the electron barrier layer into the p-type cladding layer side, relative to the electrons injected from the n-type layers into the active layer.

Next, FIG. 5 shows results of calculating slope efficiencies of the semiconductor light emitting device when the thickness of the p-type AlGaN electron barrier layer 10 is changed with respect to the case where the Al composition ratio of the p-type AlGaN electron barrier layer 10 is set as being 0.15, 0.18 and 0.23. FIG. 6 shows results of calculating a rate of the electrons overflowing from the p-type AlGaN electron barrier layer 10 into the p-type AlGaN cladding layer 11 side, relative to the electrons injected from the n-type layers into the multiple quantum well active layer 6. As can be seen from FIG. 5, when the thickness of the p-type AlGaN electron barrier layer 10 is in the range of about 4 to about 5 nm in each of the three cases, the differential efficiency takes a maximum value, and an overflow amount of electrons takes the smallest value. On the other hand, when the thickness of the p-type AlGaN electron barrier layer 10 is smaller than about 2 nm, conversely, the slope efficiency decreases in each of the three cases. The reason for this is because it is thought that the electrons move to the p-type AlGaN cladding layer 11 side due to the tunnel effect.

Consequently, the high differential efficiency can be obtained when the thickness of the p-type AlGaN electron barrier layer 10 is equal to or larger than 2 nm and equal to or smaller than 7 nm. In particular, the higher differential efficiency can be obtained when the thickness of the p-type AlGaN electron barrier layer 10 is equal to or larger than 3 nm and equal to or smaller than 6 nm.

Here, in the p-type AlGaN electron barrier layer 10, when the Al composition ratio is small, an overflow amount of electrons increases because the band gap becomes small. On the other hand, when the Al composition ratio is large, there is a problem in crystalline. Consequently, the Al composition ratio of the p-type AlGaN electron barrier layer 10 is preferably equal to or larger than 0.1 and equal to or smaller than 0.3, and more preferably is equal to or larger than 0.15 and equal to or smaller than 0.23.

In addition, a single or plural intermediate layers each having a smaller band gap than that of the AlGaN electron barrier layer are inserted between the multiple quantum well active layer and the AlGaN electron barrier layer. The intermediate layer(s) has an $In_xGa_{1-x}N$ ($0 \leq x \leq 1$) layer not containing therein Al but contacting the AlGaN electron barrier layer. As a result, a difference in band gap between the AlGaN electron barrier layer and the intermediate layer(s) is increased and the effective height of the AlGaN electron barrier layer is increased, thereby suppressing the overflow of the electrons. Moreover, the introduction of the strain reverse in direction to that in the AlGaN electron barrier layer makes it possible to reduce the strain/stress. In addition, the intermediate layer(s) is preferably an un-doped layer from a viewpoint of the light absorption due to the p-type dopant.

When the intermediate layer(s) is thin, there is obtained the effect of increasing the effective height of the AlGaN electron barrier layer, while when it is thick, there is encountered the problem such that the crystalline becomes worse. For this reason, the thickness of the intermediate layer(s) is preferably equal to or larger than 2 nm and equal to or smaller than 20 nm, and is more preferably equal to or larger than 4 nm and equal to or smaller than 10 nm. In addition, in the structure described above, the single or plural intermediate layers are formed between the multiple quantum well active layer and the AlGaN electron barrier layer. However, it goes without saying that the above-mentioned effect can be obtained even with the structure in which there is no intermediate layer, and thus the multiple quantum well active layer and the AlGaN electron barrier layer directly contact each other since the function of the AlGaN electron barrier layer, the piezo effect and the like are identical to those in the first embodiment.

Furthermore, although the above description has been given with respect to the semiconductor laser, it is to be understood that the same effect as that of the first embodiment can be obtained even in the case of a semiconductor light emitting diode having the same stricture as that of the semiconductor laser. In this case as well, the InGaN intermediate layer 9 must be formed so that the difference in band gap between the AlGaN electron barrier layer 10 and the InGaN intermediate layer 9 is increased to increase the effective height of the AlGaN electron barrier layer 10, thereby suppressing the overflow of the electrons. Therefore, the band gap of the InGaN intermediate layer 9 must be made smaller than that of the layer nearest the AlGaN electron barrier layer 10 among the individual layers constituting the active layer.

The GaN substrate 1 is used in the first embodiment. However, even when there is used a substrate in which a low-temperature GaN buffer layer is grown on a substrate such as a sapphire substrate having a lattice mismatch with GaN, or a substrate in which a base layer having a lattice constant near that of GaN is made on a sapphire substrate by utilizing a transverse growth technique, the same effect as that of the first embodiment is offered.

In addition, although the case of the semiconductor laser has been described in the first embodiment, the present invention can be similarly applied to even the case of the semiconductor light emitting diode having the same structure as that of the semiconductor laser of the first embodiment.

Also, the case where the Al composition ratio of the p-type AlGaN electron barrier layer 10 is set to 0.18 has been described in the first embodiment so far. However, when the electron barrier layer 10 is made of $In_xAl_yGa_{1-x-y}N$ ($0 \leq x \leq 1$ and $0 \leq y \leq 1$), and this material has a smaller lattice constant than that of the GaN material as the substrate material, the p-type AlGaN electron barrier layer 10 undergoes the tensile stress to generate the piezo electric field in the same direction as that of the AlGaN material. As a result, the same effect as that in the first embodiment is offered. However, the p-type AlGaN electron barrier layer 10 made of $Al_xGa_{1-x}N$ ($0 \leq x \leq 1$) has the smaller lattice constant and the larger piezo effect than those in the p-type AlGaN electron barrier layer 10 made of $In_xAl_yGa_{1-x-y}N$ ($0 \leq x \leq 1$ and $0 \leq y \leq 1$). As a result, the larger effect of the invention is obtained in this case, Second Embodiment A semiconductor light emitting device according to a second embodiment of the present invention is different from that of the first embodiment in that a p-type AlGaN electron barrier layer 10 has an Al composition ratio of 0.16 and a thickness of 5 nm.

Since the p-type AlGaN electron barrier layer 10 has the small Al composition ratio, an influence by the strain is small, which is effective in improvement in the reliability of the semiconductor light emitting device. Normally, when the Al composition ratio of the p-type AlGaN electron barrier layer 10 becomes small, an overflow amount of electrons increases. However, the thinning of the p-type AlGaN electron barrier layer 10 enables the overflow of the electrons to be suppressed. For this reason, the semiconductor light emitting device according to the second embodiment shows the very excellent characteristics in which the threshold at 75° C. is 47 mA, and the differential efficiency is 1.42 W/A.

Third Embodiment

A semiconductor light emitting device according to a third embodiment of the present invention is different from that of the first embodiment in that a p-type AlGaN electron barrier layer 10 has an Al composition ratio of 0.22 and a thickness of 3 nm.

Since the p-type AlGaN electron barrier layer 10 has the large Al composition ratio, the barrier height of the electron barrier layer 10 is large. Moreover, since the piezo electric field is large, the barrier height of the electron barrier layer 10 can be made larger. Consequently, the large effect of suppressing the overflow of the electrons is obtained, and the very high efficiency and the more satisfactory temperature characteristics are obtained.

Fourth Embodiment

A semiconductor light emitting device according to a fourth of the present invention is different from that of the first embodiment in that a p-type AlGaN electron barrier layer 10 has an Al composition ratio of 0.22 and a thickness of 5 nm, and no InGaN intermediate layer 9 is formed. Other respects of the fourth embodiment are the same in structure as those of the first embodiment.

The InGaN intermediate layer must be grown at a lower temperature than that of each of the AlGaN layer underlying the InGaN intermediate layer and the AlGaN layer overlying the InGaN intermediate layer by about 200° C. Thus, the number of crystal defects may increase due to the temperature stress at this time. On the other hand, according to the fourth embodiment, the effective height of the p-type AlGaN electron barrier layer 10 is increased. Hence, even when no InGaN intermediate layer 9 is formed, the excellent characteristics can be obtained. Also, since there is no thermal stress in the phase of growth of the InGaN intermediate layer, the highly reliable semiconductor light emitting device can be obtained.

Fifth Embodiment

A semiconductor light emitting device according to a fifth embodiment of the present invention is different from that of the first embodiment in that neither of the AlGaN intermediate layer 8 and the InGaN intermediate layer 9 is formed, and thus the p-type AlGaN electron barrier layer 10 and the multiple quantum well active layer 6 directly contact each other. In this case as well, since the function of the p-type AlGaN electron barrier layer 10, the piezo effect and the like are the same as those in the first embodiment, the same effects as those of the first embodiment are offered.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-026127, filed on Feb. 2, 2006 and a Japanese Patent Application No. 2007-009373, filed on Jan. 18, 2007 including specification, claims, drawings and summary, on which the Convention priority of the present application is based, are incorporated herein by reference in its entirety.

What is claimed is:

1. A semiconductor light emitting device including a gallium nitride compound semiconductor, the device comprising:
    a substrate; and
    a first cladding layer having a first conductivity type, an active layer, an electron barrier layer having a second conductivity type and of $In_xAl_yGa_{1-x-y}N$ ($0 \leq x \leq 1$ and $0 \leq y \leq 1$), and a second cladding layer having the second conductivity type, laminated, in order, on the substrate wherein
    the electron barrier layer has a larger band gap than each of the active layer and the second cladding layer, and thickness of the electron barrier layer is in a range from 2 nm to 7 nm.

2. The semiconductor light emitting device according to claim 1, wherein the thickness of the electron barrier layer is in a range from 3 nm to 6 nm.

3. The semiconductor light emitting device according to claim 1, wherein the electron barrier layer is $Al_xGa_{1-x}N$ ($0 \leq x \leq 1$).

4. The semiconductor light emitting device according to claim 1, wherein Al composition ratio of the electron barrier layer is in a range from 0.1 to 0.3.

5. The semiconductor light emitting device according to claim 1, including a single or plural intermediate layers between the active layer and the electron barrier layer, wherein each of the single or plural intermediate layers has a smaller band gap than the electron barrier layer.

6. The semiconductor light emitting device according to claim 5, wherein the single or plural intermediate layers include an $In_xGa_{1-x}N$ ($0 \leq x \leq 1$) layer contacting the electron barrier layer.

7. The semiconductor light emitting device according to claim 1, wherein the active layer and the electron barrier layer contact each other.

8. The semiconductor light emitting device according to claim 5, wherein the plural intermediate layers include a first intermediate layer contacting the electron barrier layer, and a second intermediate layer having a larger band gap than the first intermediate layer.

9. The semiconductor light emitting device according to claim 8, wherein the first intermediate layer is $In_xGa_{1-x}N$ ($0 \leq x \leq 1$).

10. The semiconductor tight emitting device according to claim 5, wherein each of the single or plural intermediate layers is an un-doped layer.

* * * * *